(12) United States Patent
Micciche' et al.

(10) Patent No.: US 8,525,253 B2
(45) Date of Patent: Sep. 3, 2013

(54) DOUBLE-SIDED SEMICONDUCTOR STRUCTURE AND METHOD FOR MANUFACTURING SAME

(75) Inventors: Monica Micciche', Enna (IT); Antonio Giuseppe Grimaldi, S. Giovanni La Punta (IT); Gaetano Bazzano, Floridia (IT); Nicolò Frazzetto, S. Giovanni La Punta (IT)

(73) Assignee: STMicroelectronics S.r.l., Agrate Brianz (MI) (IT)

( * ) Notice: Subject to any disclaimer, the term of this patent is extended or adjusted under 35 U.S.C. 154(b) by 377 days.

(21) Appl. No.: 12/913,316

(22) Filed: Oct. 27, 2010

(65) Prior Publication Data

US 2011/0095358 A1 Apr. 28, 2011

(30) Foreign Application Priority Data

Oct. 28, 2009 (IT) ................ TO2009A0828

(51) Int. Cl.
*H01L 29/78* (2006.01)
*H01L 21/8238* (2006.01)

(52) U.S. Cl.
USPC ............... 257/328; 257/621; 257/E27.029; 438/212; 438/268

(58) Field of Classification Search
USPC ............... 257/328, 621, E27.029; 438/212, 438/268
See application file for complete search history.

(56) References Cited

U.S. PATENT DOCUMENTS

| | | | |
|---|---|---|---|
| 6,150,708 A | 11/2000 | Gardner et al. | |
| 2002/0190340 A1 | 12/2002 | Moriguchi et al. | |
| 2003/0127724 A1 | 7/2003 | Senba | |
| 2003/0209781 A1* | 11/2003 | Hattori | 257/565 |
| 2008/0296675 A1 | 12/2008 | Yanagida | |

FOREIGN PATENT DOCUMENTS

| | | |
|---|---|---|
| DE | 9 417 362 U | 1/1995 |
| JP | 61201456 A | 9/1986 |
| JP | 2210857 A | 8/1990 |
| JP | 10229162 A | 8/1998 |
| JP | 2009135414 A | 6/2009 |

OTHER PUBLICATIONS

Italian Search Report dated Jun. 1, 2010 from corresponding Italian Application No. TO20090828.
Written Opinion dated Jun. 1, 2010 from corresponding Italian Application No. TO20090828.

* cited by examiner

*Primary Examiner* — Long K Tran
(74) *Attorney, Agent, or Firm* — Wolf, Greenfield & Sacks, P.C.

(57) ABSTRACT

A semiconductor structure including a substrate of semiconductor material of a first type of conductivity; a first semiconductor layer set in direct electrical contact with the substrate on a first side of the substrate; a second semiconductor layer set in direct electrical contact with the substrate on a second side of the substrate; a first active electronic device formed in the first semiconductor layer; and a second active electronic device formed in the second semiconductor layer.

22 Claims, 11 Drawing Sheets

DOUBLE-SIDED SEMICONDUCTOR STRUCTURE AND METHOD FOR MANUFACTURING SAME

CROSS REFERENCE TO RELATED APPLICATIONS

This application claims the priority benefit of Italian patent application number TO2009A000828, filed on Oct. 28, 2009, entitled "Double-Sided Semiconductor Structure and Method for Manufacturing the Same," which is hereby incorporated by reference to the maximum extent allowable by law.

BACKGROUND OF THE INVENTION

1. Field of the Invention

The present invention relates to a double-sided semiconductor structure and to a method for manufacture thereof.

2. Discussion of the Related Art

Integrated circuits in CMOS (Complementary Metal Oxide Semiconductor) technology of a conventional type generally comprise devices of a P type and of an N type formed in a coplanar way, on the same level of a semiconductor substrate of a wafer. In addition, in the same substrate, there are frequently formed other devices, such as for example diodes. Some process steps are common to all the devices obtained in said substrate, but many other steps require being performed separately. In this case, appropriate masks are used for protecting some areas of the substrate during processing of other areas of the same substrate. Furthermore, above all in the case of formation of high-performance devices, it is frequently advantageous to use materials and process steps that are different for each device. Obtaining said devices on separate wafers not only increases the production costs, but introduces problems of connection of contacts and delay in propagation of the signals in the case where different devices have to be housed in one and the same package and operate jointly.

A solution for increasing the production density of MOSFET devices has been proposed in the U.S. Pat. No. 7,485,508, which describes a method for forming horizontal-conduction MOSFET devices, electrically insulated from one another, on opposite sides of a substrate of a SOI (Semiconductor-On-Insulator) type. In this case, MOSFET devices of an N type are formed on one side of the SOI substrate and, separately, on the opposite side of the SOI substrate MOSFET devices of a P type are formed. The electrical contacts for all the devices provided in the SOI substrate are obtained on just one side of the SOI substrate itself, by formation of conductive vias. Said solution enables an increase in the density of the devices for a single wafer, but does not solve problems of performance, connection of contacts, and delay in propagation of the signals involved.

An aim of the present invention is consequently to provide a double-sided semiconductor structure and a method for manufacture thereof that will enable the above drawbacks to be overcome.

According to one embodiment of the present invention, there is provided a semiconductor structure comprising a substrate of semiconductor material of a first type of conductivity, a first semiconductor layer arranged in direct electrical contact with the substrate on a first side of the substrate, a second semiconductor layer arranged in direct electrical contact with the substrate on a second side of the substrate, a first active electronic device formed in the first semiconductor layer; and a second active electronic device formed in the second semiconductor layer.

According to another embodiment of the present invention, there is provided a method for manufacturing a semiconductor structure comprising the steps of providing a substrate of semiconductor material of a first type of conductivity and having a first side and a second side, opposite to one another, forming, on the first side of the substrate, a first semiconductor layer, forming, on the second side of the substrate, a second semiconductor layer, forming, in the first semiconductor layer, a first active electronic device; and forming, in the second semiconductor layer, a second active electronic device.

BRIEF DESCRIPTION OF THE DRAWINGS

For a better understanding of the present invention, a preferred embodiment thereof is now described, purely by way of non-limiting example and with reference to the attached drawings, wherein.

DETAILED DESCRIPTION

Figure 1:
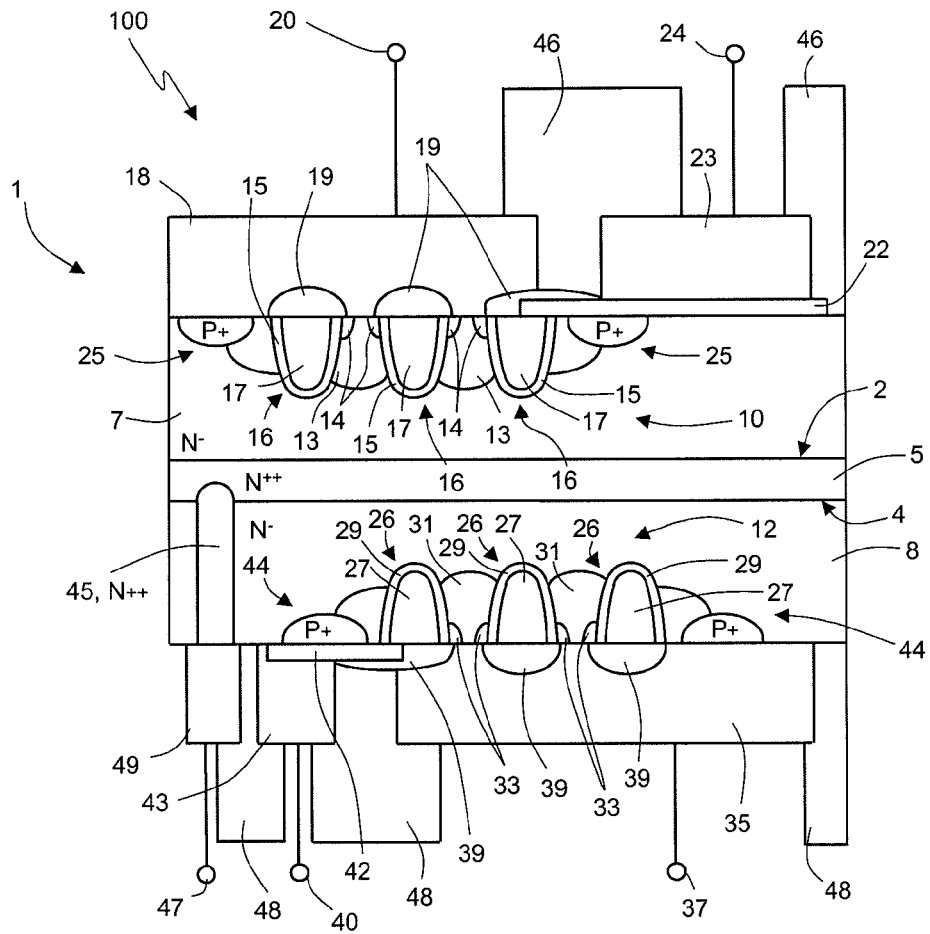
FIG. 1 shows a cross-sectional view of a semiconductor structure comprising active electronic devices, in particular MOSFETs, provided on both sides of said structure according to one embodiment of the present invention.

FIG. 1 shows a cross-sectional view of an electronic device 100 obtained in a wafer 1 comprising a substrate 5, made of semiconductor material with a doping of an N++ type, provided with a first side 2 and a second side 4. Formed on the first side 2, and in direct contact therewith, is a first epitaxial layer 7, made of silicon with a doping of an N− type, whilst formed on the second side 4, and in direct contact therewith, is a second epitaxial layer 8, which is also made of silicon with a doping of an N− type.

Formed in the first epitaxial layer 7 is a first transistor element 10, in particular a power MOSFET of a vertical-channel type, whilst formed in the second epitaxial layer 8 is a second transistor element 12, in particular a power MOSFET of a vertical-channel type.

In greater detail, the first transistor element 10 comprises a plurality of first body regions 13 with a doping of a P type, formed in the first epitaxial layer 7 and separated from one another by first gate regions 16, which extend within the first epitaxial layer 7 towards the substrate 5. Each gate region 16 comprises a first gate-oxide layer 15, which coats the respective gate region 16 internally, and a first conductive gate region 17, made of conductive material, insulated from the first epitaxial layer 7 and from the first body regions 13 by means of the first gate-oxide layer 15. Each first body region 13 houses a plurality of first source regions 14 with a doping of an N type, which extend within the body region 13 and face a surface 7a of the first epitaxial layer 7 (i.e., they face the side of the first epitaxial layer 7 opposite to the side of interface with the semiconductor substrate 5). The first source regions 14 are connected, via a first source-contact metallization 18, to a first source terminal 20. The first source-contact metallization 18 is formed on top of the first epitaxial layer 7, in direct electrical contact with the first source regions 14. In addition, first gate-insulation regions 19 are arranged on each of the first gate regions 16 so as to insulate electrically the first conductive gate region 17 of each of the first gate regions 16 from the first source-contact metallization 18. The first conductive gate regions 17 of the first gate regions 16 are in electrical contact with one another (in a way not illustrated, for example by means of a conductive layer set on top of the first epitaxial layer 7 so as to contact each first conductive gate region 17). In addition, a first conductive gate region 17 (for example, as illustrated in FIG. 1, the first conductive gate region 17 of a first gate region 16 set, in cross-sectional view, laterally with respect to the other first gate regions 16) is connected to a first gate terminal 24 via a first gate-contact layer 22, in direct electrical contact with the first conductive gate region 17 of the first gate region 16. A first gate-contact metallization 23 is formed on, and in direct electrical contact with, the first gate-contact layer 22, and is connected to the first gate terminal 24.

Finally, the first transistor element 10 is surrounded by a first guard ring 25, of a P type, which extends in the first epitaxial layer 7 and faces the surface of the first epitaxial layer 7, on the outside of, and contiguous to, the first gate regions 16.

Said first guard ring 25 forms a PN diode with the first epitaxial layer 7 so as to prevent edge breakdown during use of the first transistor element 10.

As has been said, a second transistor element 12 is formed in the second epitaxial layer 8. In the embodiment illustrated in FIG. 1, the second transistor element 12 is similar to the first transistor element 10 and comprises a plurality of second gate regions 26, which extend in the second epitaxial layer 8 towards the substrate 5 and face a surface 8a of the second epitaxial layer 8 (i.e., they face the side of the second epitaxial layer 8 opposite to the side of interface with the semiconductor substrate 5). Each second gate region 26 includes a respective second conductive gate region 27, made of conductive material, insulated from the second epitaxial layer 8 by means of a second gate-oxide layer 29, in a way similar to what has been described with reference to the first gate regions 16. Each second gate region 26 is separated from other second gate regions 26 by respective second body regions 31 of a P type. Each second body region 31 houses a plurality of second source regions 33 of an N type. Set on top of and in direct contact with the surface 8a of the second epitaxial layer 8 is a second source-contact metallization 35, for connecting the second source regions 33 electrically with a second source terminal 37. The second conductive gate regions 27 of the second gate regions 26 are electrically insulated from the second source-contact metallization 35, which is set on top of them, by means of respective second gate-insulation regions 39 made of dielectric material.

The second conductive gate regions 27 of the second gate regions 26 are in electrical contact with one another (in a way similar to what has been described with reference to the first conductive gate regions 17 of the first transistor element 10).

In addition, a second conductive gate region 27 (for example, the second conductive gate region 27 of a second gate region 26, which is set, in lateral cross-sectional view, externally with respect to the other second gate regions 26), is connected to a second gate terminal 40 via a second gate-contact layer 42 made of conductive material. A second gate-contact metallization 43 is formed on top of and in direct electrical contact with the second gate-contact layer 42 and is connected to the second gate terminal 40.

In the wafer 1 there is moreover obtained a drain region 45 common to both the first transistor element 10 and the second transistor element 12. The drain region 45 extends through the second epitaxial layer 8 until it reaches and contacts the substrate 5 and can be made of conductive material, for example doped polysilicon or metal, or by means of implantation and activation of dopant species of an N type in the second epitaxial layer 8, forming an implanted region of an N++ type. The drain region 45 is finally in electrical contact with a drain terminal 47 via a drain metallization 49.

In a way similar to what has been described with reference to the first transistor element 10, the second transistor element 12 is surrounded by a second guard ring 44, of a P type, which extends in the second epitaxial layer 8 and faces the surface 8a of the second epitaxial layer 8, on the outside of, and contiguous to, the second gate regions 26. Said second guard ring 44 forms a PN diode with the second epitaxial layer 8 so as to prevent edge breakdown during use of the second transistor element 12. The first and second guard rings 25, 44 can be biased at the voltage of the body regions 13, 31 or, in particular in high-voltage devices (for example, with drain breakdown voltage BVdss>200 V), can be left floating. In the latter case, the first and second guard rings 25, 44 are biased during depletion of the first and second epitaxial layers 7, 8.

Finally, a first protective layer 46 and a second protective layer 48 are formed on opposite sides of the wafer 1, on the first and second epitaxial layers 7, 8 in such a way as to protect possible portions of the first and second epitaxial layers 7, 8 and/or of the first and second gate-insulation regions 19, 39 that have remained exposed.

In use, the gate terminal 24, 40 of the respective transistor elements 10, 12 (MOSFETs with vertical N channel) is biased at a voltage comprised between 1 V and 15 V, preferably 10 V. Gate biasing modulates the conductivity of the channel of the respective transistor elements 10, 12, generating an inversion of charge in the first and second body regions 13, 31 and thus setting up a channel for the majority charge carriers. By applying a potential difference between the source terminals 20, 37 and the drain terminal 47 comprised between 12 V and 3000 V, for example equal to 30 V, the majority charge carriers (electrons in the example considered) flow from the first and second source regions 14, 33, towards the drain region 45, respectively through the first and second epitaxial layers 7, 8 and the substrate 5.

Figure 2:
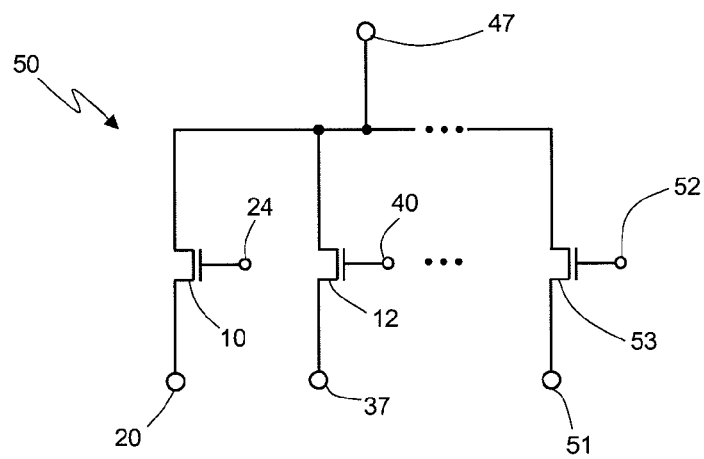
FIG. 2 shows a circuit representation of the semiconductor structure of FIG. 1.

FIG. 2 shows an electrical diagram 50 of the structure of FIG. 1, comprising the first transistor element 10, which has its own first source terminal 20 and its own first gate terminal 24, and the second transistor element 12, which has its own second source terminal 37 and its own second gate terminal 40. The drain terminal 47 of the first transistor element 10 and of the second transistor element 12 is in common with the two transistors.

A plurality of further transistor devices can be provided on one or both of the sides of the wafer 1 (a third transistor device 53 is illustrated in FIG. 2), for example of the same type as the transistor elements 10, 12, each having a respective source terminal and gate terminal of its own (see the source terminal 51 and gate terminal 52 of the transistor device 53 in FIG. 2) but having the same drain terminal 45 in common.

Figure 3:
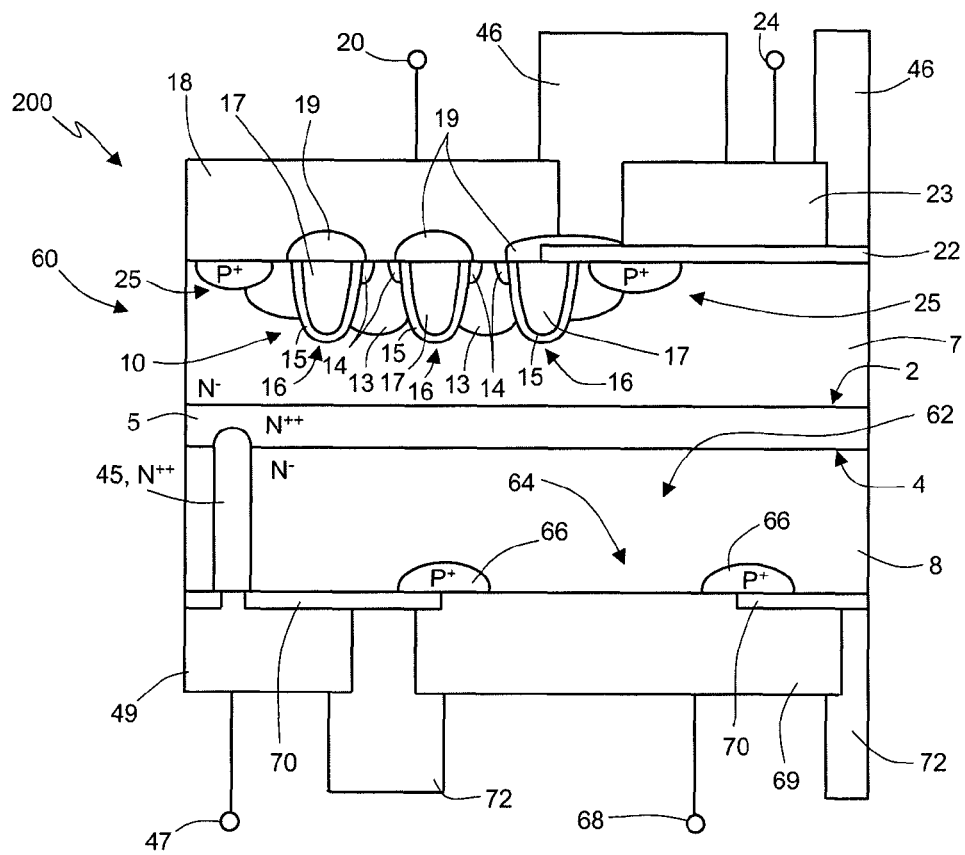
FIG. 3 shows a cross-sectional view of a semiconductor structure comprising active electronic devices, in particular a MOSFET and a Schottky diode, provided on both sides of said structure according to another embodiment of the present invention.

FIG. 3 shows, in cross-sectional view, an electronic device 200 obtained in a wafer 60, which comprises, in a way similar to what has already been described with reference to the wafer 1 of FIG. 1: the substrate 5 of an N++ type; the first epitaxial layer 7, of an N− type, formed on the first side 2 of the substrate 5 and in direct contact therewith; the second epitaxial layer 8, which is also of an N− type, formed on the second side 4 of the substrate 5 and in direct contact therewith; the first transistor element 10, obtained in the first epitaxial layer 7; the first guard ring 25, which surrounds the first transistor element 10; and the drain region 45, which extends into the second epitaxial layer 8 until it contacts the substrate 5 and is in electrical contact with the drain terminal 47 via the drain metallization 49.

Unlike what has been illustrated and described with reference to the wafer 1 of FIG. 1, the wafer 60 comprises a diode obtained in the second epitaxial layer 8. In particular, illustrated in FIG. 3 is a Schottky diode 62, comprising an anode region 64 defined by a ring structure 66, for example obtained by means of implantation of dopant species of a P type, connected to an anode terminal 68 through an anode metallization 69.

According to this embodiment, the drain region 45 performs also the function of cathode region for the Schottky diode 62. Portions external to the anode region 64 are insulated from the anode metallization 69 by means of an anode-insulation layer 70, made of dielectric material. Exposed portions of the insulation layer 70 are protected through formation of a third protective layer 72.

In use, the first transistor element 10 can be biased as described with reference to FIG. 1, whilst, as regards the Schottky diode 62, the latter can be biased by applying a potential difference between the anode terminal and the drain terminal 47 (in this embodiment, the drain terminal 47 has at the same time the function of cathode terminal for the diode 62 and of drain terminal for the first transistor element 10) comprised between 12 V and 3000 V, for example 30 V.

Figure 4:
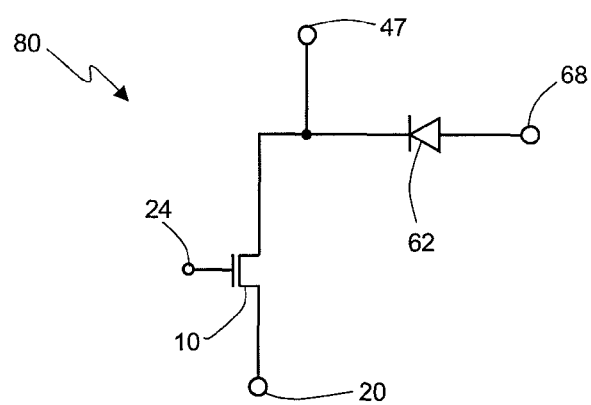
FIG. 4 shows a circuit representation of the semiconductor structure of FIG. 3.

FIG. 4 shows an electrical diagram 80 of the structure of FIG. 3, comprising the first transistor element 10, having its own first source terminal 20 and its own first gate terminal 24, and the Schottky diode 62, having its own anode terminal 68. As has been said, the drain terminal of the first transistor element 10 and the cathode terminal of the Schottky diode 62 coincide (terminal in common designated in the figure by the reference number 47).

FIGS. 5-16 show successive steps of a method for manufacturing the electronic device 100 of FIG. 1, in cross-sectional view.

First of all (FIG. 5), the substrate 5 is provided, made of silicon with a doping of an N++ type (for example, doped by means arsenide As or red phosphorus Pred dopant species). The substrate 5 is of a double-side-polished type. On the first side 2 and on the second side 4 of the substrate 5, there are respectively formed, by means of epitaxial growth, the first epitaxial layer 7, of an N− type, and the second epitaxial layer 8, of an N− type. The first and second epitaxial layers 7, 8 have respective thicknesses comprised between 2 μm and 500 μm, for example with the same value of 4.5 μm.

Then (FIG. 6), formed on the surface 7a of the first epitaxial layer 7 and on the surface 8a of the second epitaxial layer 8 are a respective first protective layer 101 and second protective layer 102, for example of deposited or thermally grown silicon oxide. Moreover formed on the first protective layer 101 is a third protective layer 103, for example of deposited polysilicon, to enable subsequent processing of the second epitaxial layer 8 without damaging the first protective layer 101 and the first epitaxial layer 7. The second protective layer 102 is then subjected to successive lithography and etching steps for defining a window 106 through the second protective layer 102 in such a way as to expose a portion of the surface 8a of the second epitaxial layer 8, for example, in top plan view, of a rectangular or circular shape.

Next (FIG. 7), through a step of ion implantation of dopant species of an N type, for example phosphorus, and a subsequent step of thermal annealing to enable diffusion and activation of the implanted dopant species, the drain region 45 is formed. During the implantation step, the second protective layer 102 acts as a mask. In this way, the drain region 45 is formed only in the region of the second epitaxial layer exposed through the window 106. In particular, given a thickness of the second epitaxial layer 8 in the range previously indicated, to obtain a drain region 45 that extends until it contacts the substrate 5 it is expedient to perform an implantation at an energy comprised between 60 keV and 200 keV and a thermal annealing at a temperature comprised between 1000° C. and 1250° C. For epitaxy thicknesses of more than 4 μm, it is preferable to grow a plurality of epitaxial layers alternated with phosphorus implants, then diffused with a common thermal process.

Next (FIG. 8), the second protective layer 102 is removed, and formed on the surface 8a of the second epitaxial layer 8, by means of successive steps of deposition and removal of polysilicon, are first alignment marks 108, for example of a known type shaped like a cross used during successive process steps. Then, formed on the surface 8a of the second epitaxial layer 8 is a first mask layer 110, for example of deposited silicon oxide. Next, in the first mask layer 110 there is opened, at the side of the drain region 45, a window 112, for example, in top plan view, of a circular or quadrangular shape. Then, a step of ion implantation of dopant species of a P type, for example boron, is performed to form a first implanted region 113 of a P+ type having a shape defined by the window 112. Next, formed on the surface 8a of the second epitaxial layer 8 and of the first mask layer 110 is a third protective layer 114, for example of deposited polysilicon, for protecting exposed portions of the second epitaxial layer 8, the first mask layer 110, and the first alignment marks 108 during subsequent processing steps.

Then processing of the opposite side of the wafer 1 is performed. Provided on the surface 7a of the first epitaxial layer 7 is a second mask layer 116, for example of deposited silicon oxide. A window 118 is opened in the second mask layer 116, similar in shape and dimensions to the window 112 formed in the first mask layer 110, and this is followed by a step of implantation of dopant species of a P type, for example boron, so as to form a second implanted region 115 of a P+ type, having a shape and dimensions defined by the window 118. Then (FIG. 9), a thermal annealing of the wafer 1 is carried out, for example at a temperature of approximately 1100° C., to favour diffusion and activation of the dopant species of a P type of the first and second implanted regions 113, 115, thus forming a first portion 25' of the first guard ring 25 and a first portion 44' of the second guard ring 44. Both of the portions 25' and 44' of the guard rings 25 and 44 have, in a respective top plan view, for example a circular or quadrangular shape, and a width (following upon the diffusion step) comprised between 5 and 400 μm, preferably 5 μm.

Then (FIG. 10) formation of the first gate regions 16 in the first epitaxial layer 7 is performed according to the known techniques. In particular, the gate regions 16 are formed in a portion of the first epitaxial layer 7 that is limited externally by the first portion 25' of the first guard ring 25. For this purpose, the second mask layer 116 is removed from the wafer 1 in a selective way, thus forming a third mask layer 117 that leaves exposed a surface portion of the first epitaxial layer 7 delimited by the first portion 25' of the first guard ring 25. In particular, with the aid of successive masks (formed in a way that is known and for this reason is not illustrated), steps of lithography and etching of the first epitaxial layer 7 are carried out to form a plurality of trenches in which the first gate regions 16 are to be provided. For example, the first epitaxial layer 7 is etched by means of the RIE (Reactive Ion Etching) technique, to form in the first epitaxial layer 7 one or more trenches having a depth comprised between 0.4 µm and 2.5 µm, preferably 1.2 µm, and, in top plan view, a strip-like shape or else a rectangular, or hexagonal, shape or some other shape. Then, the first gate-oxide layer 15 is formed inside each trench and so as to coat the side edges and the bottom of each trench.

The first gate-oxide layer 15 is, in the embodiment illustrated, deposited silicon oxide ($SiO_2$), having a thickness comprised between 10 nm and 150 nm, preferably 20 nm. Next, the first conductive gate region 17 is formed, for example by depositing polysilicon with a doping of an N type, in contact with the first gate-oxide layer 15 and in such a way as to fill each trench and form the first gate regions 16.

Then, on the surface 7a of the first epitaxial layer 7 second alignment marks 120 are formed, for example of polysilicon, similar to the first alignment marks 108.

A fourth protective layer 122, for example of polysilicon, is formed on the first epitaxial layer 7, to protect the exposed portions of the first epitaxial layer 7, of the first gate-oxide layer 15, of the first conductive gate region 17, and of the first portion 25' of the first guard ring 25.

Next (FIG. 11) the second gate regions 26 are formed in the second epitaxial layer 8.

For this purpose, the third protective layer 114 is removed, and the first mask layer 110 is defined so as to expose a portion of the second epitaxial layer 8 delimited internally by the first portion 44' of the second guard ring 44 so as to form a fourth mask layer 123. Then, according to known techniques and in a way similar to what has been described with reference to formation of the first gate regions 16, formed in the second epitaxial layer 8 for example by means of a RIE etching, is a plurality of trenches in which the second gate regions 26 are to be provided. Said trenches have a shape and dimensions that are the same as the ones referred to previously with reference to the trenches in which the first gate regions 16 are obtained.

This is followed by formation, inside each trench, of the second gate-oxide layer 29, for example made of silicon oxide ($SiO_2$), deposited on the inner walls and on the bottom of the trenches, and of the second gate regions 27, for example made of polysilicon with a doping of an N type deposited so as to fill the trenches. The second gate regions 26 are thus formed.

Next, formed by means of implantation of dopant species of a P type, for example boron, are the second body regions 31 and, at the same time, a second portion 44" of the second guard ring 44, of a P– type, set adjacent to the second gate regions 26 and to the first portion 44' of the second guard ring 44. The first portion 44' and the second portion 44" of the second guard ring 44 form, together, the second guard ring 44.

Then, formed on the second epitaxial layer 8 is a fourth protective layer 124, of deposited polysilicon.

This is followed (FIG. 12) by formation of the first body regions 13 in the first epitaxial layer 7, through a step of implantation of dopant species of a P type, for example boron, and, at the same time, formation of a second portion 25" of the first guard ring 25. The second portion 25" is set adjacent to the first gate regions 16, faces the first portion 25' of the first guard ring 25, and is adjacent to the first portion 25' of the first guard ring 25. The first portion 25' and the second portion 25" of the first guard ring 25 form together the first guard ring 25.

A step of thermal annealing, for example in a furnace at a temperature of between 900° C. and 1150° C., for example equal to 1000° C., enables activation and diffusion of the implanted dopant species and completion of formation of the first and second body regions 13, 31 and of the first and second guard rings 25, 44.

Figure 13:
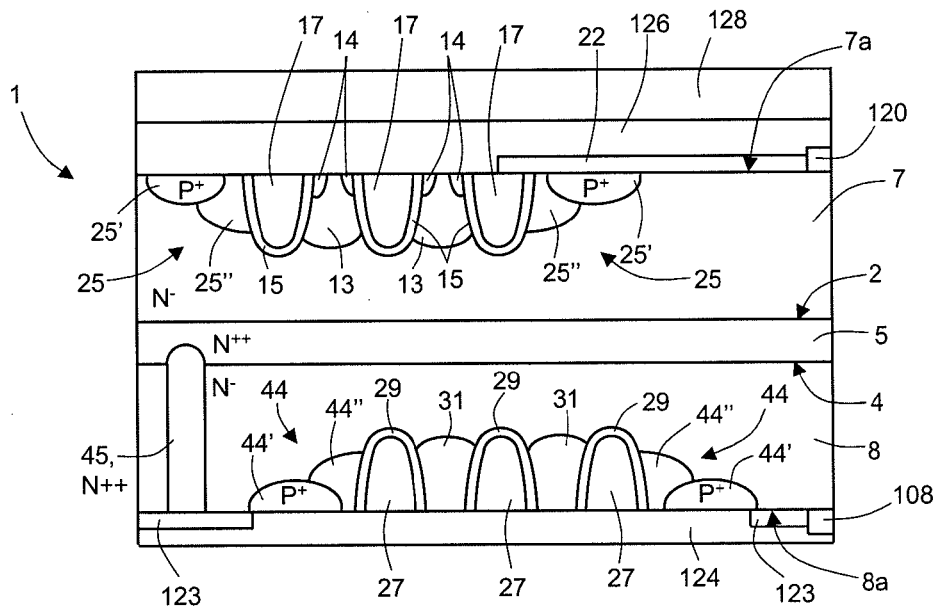
Figure 14:
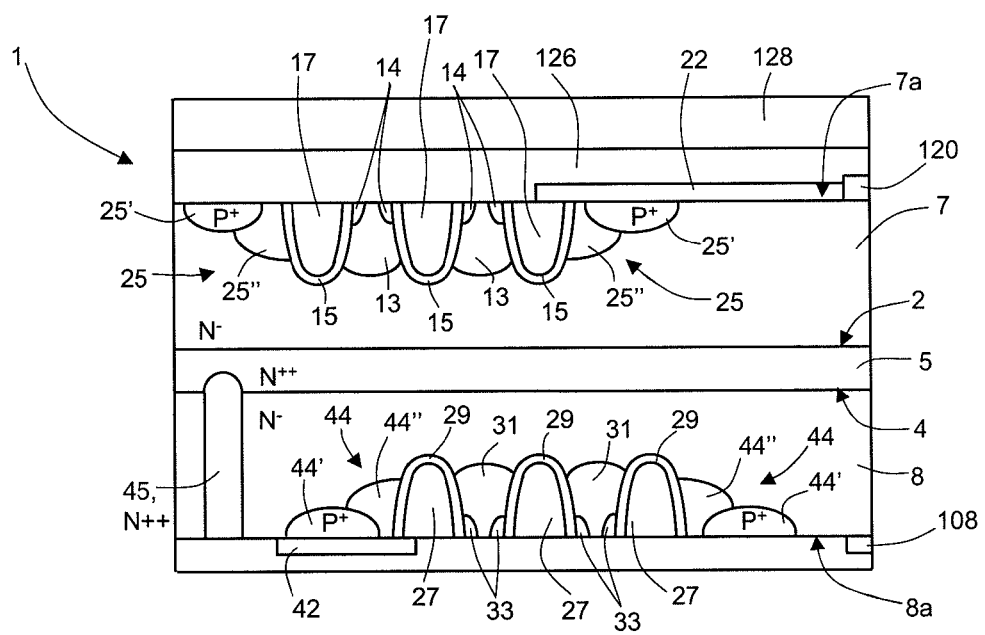
Figure 15:
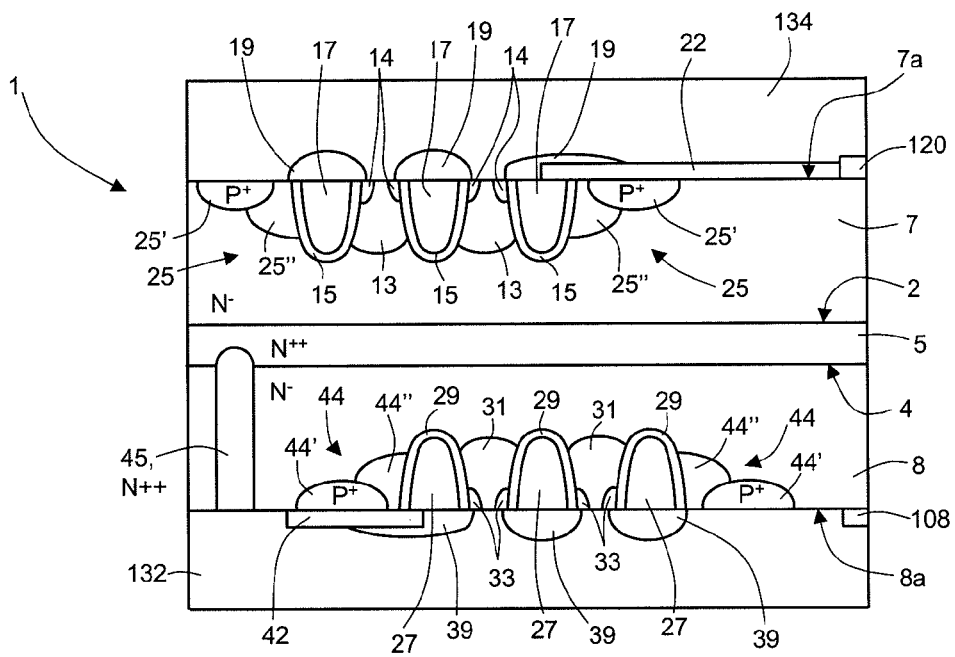
Figure 16:
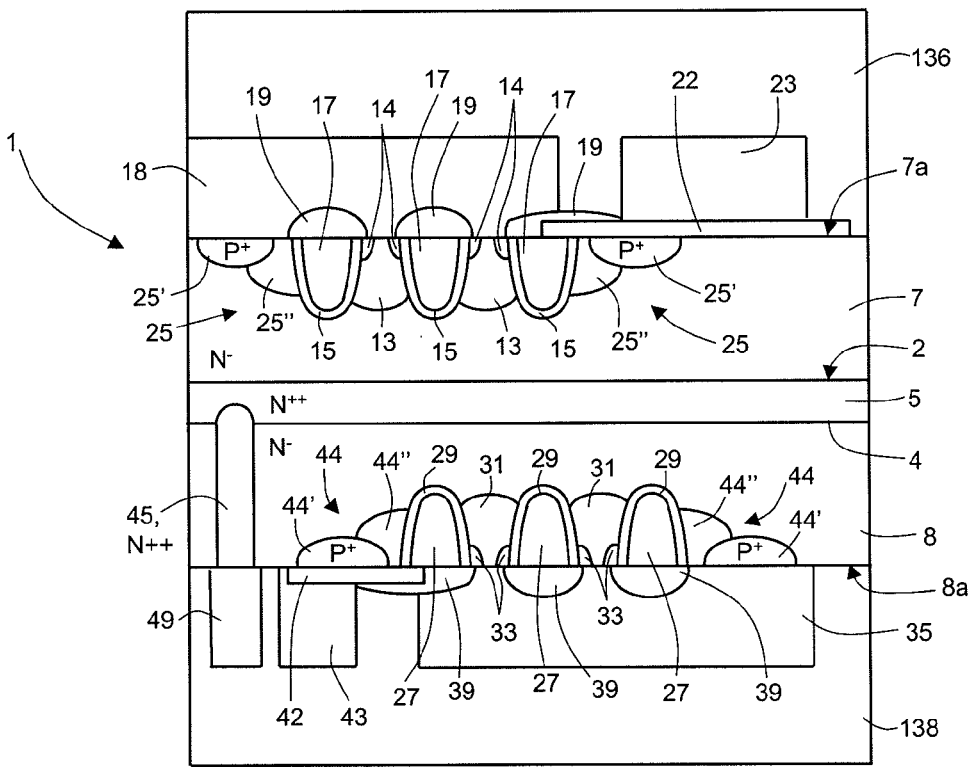

As illustrated in FIG. 13, there are then formed first source regions 14 with known techniques. The source regions 14 are formed by means of a selective implantation of dopant species of an N type, for example arsenic, within the body regions 13, and face the surface 7a of the first epitaxial layer 7. At the end of the implantation step, the third mask layer 117 is removed, and a layer of conductive material, for example polysilicon with a doping of an N type, is formed on the first epitaxial layer 7. Said layer of conductive material is selectively etched so as to form the first gate-contact layer 22. The first gate-contact layer 22 extends on the surface 7a of the first epitaxial layer 7 so as to contact all the first conductive gate regions 17, but not the first body regions 13 and the first source regions 14. Then, deposited on the first epitaxial layer 7 and the first gate-contact layer 22 is a first gate-insulation layer 126 of dielectric material, and deposited on the first gate-insulation layer 126 is a fourth protective layer 128, for example of deposited polysilicon.

Next (FIG. 14), after removal of the third protective layer 124, the second source regions 33 are formed through an implantation of dopant species of an N type, for example arsenic, within the second body regions 31, at the sides of the gate regions 16, and face the surface 8a of the second epitaxial layer 8.

The formation of the first and second source regions 14, 33 is completed by a step of thermal annealing at a temperature of between 900° C. and 1000° C., for example 1000° C., to favor activation and diffusion of the implanted dopants.

The fourth mask layer 123 is removed, and a layer of conductive material, for example polysilicon with a doping of an N type, is formed on the second epitaxial layer 8. The layer of conductive material thus formed is etched in a known way, to form the second gate-contact layer 42. In a way similar to what has been said for the first gate-contact layer 22, the second gate-contact layer 42 extends over the surface 8a of the first epitaxial layer 8 so as to contact all the second conductive gate regions 27 but not the second body regions 31 and the second source regions 33.

Formed on the second epitaxial layer is a second gate-insulation layer 130 of dielectric material, for example silicon oxide. The second gate-insulation layer 130 is selectively removed to form (FIG. 15) the second gate-insulation regions 39, on the second conductive gate regions 27. Then, a first metal layer 132 is formed, for example by deposition of an alloy of aluminium and silicon, on the second epitaxial layer 8 and on the second gate-insulation regions 39.

In a similar way, the first gate-insulation regions 19 are formed. The fourth protective layer 128 is removed and the first gate-insulation layer 126 is selectively etched so as to be removed from the wafer 1 with the exception of portions of the wafer 1 on top of, and in contact with, the first conductive gate regions 17. In this way the first gate-insulation regions 19 are formed. There is then formed, for example by means of deposition of an alloy of aluminium and silicon, on the first epitaxial layer 7 and the first gate-insulation regions 19, a second metal layer 134.

Next (FIG. 16), with known techniques (for example, with a lithographic process and subsequent etching step), the first and second metal layers 132, 134 are selectively removed so as to form the first source-contact metallization 18 and the first gate-contact metallization 23 and, respectively, the drain metallization 49, the second gate-contact metallization 43, and the second source-contact metallization 35.

Next (FIG. 16), the first and second alignment marks 108, 120 can be removed from the wafer 1. Then, formed on both sides of the wafer 1 are a first passivating layer 136 and a second passivating layer 138, for example a PSG (PhosphoSilicate Glass) deposited layer.

Finally, the first and second passivating layers 136, 138 are selectively removed to form the first and second protective layers 46, 48. In particular, the first and second protective layers 46, 48 have the function of guaranteeing electrical insulation of the first source-contact metallization 18 from the first gate-contact metallization 23 and of moreover guaranteeing electrical insulation of the drain metallization 49 from the second gate-contact metallization 43, and of the latter from the second source-contact metallization 35. There can thus be formed the first and second source terminals 20, 37, the first and second gate terminals 24, 40, the drain terminal 47, to obtain the electronic device 100 of FIG. 1.

In the case where, for the subsequent assembly of said electronic device 100, the use of clips were to become necessary, then there should be envisaged formation of a further layer of TiNiAu and subsequent passivation on both sides of the wafer 1.

There now follows a description of process steps for production of the electronic device 200 of FIG. 3.

Figure 5:
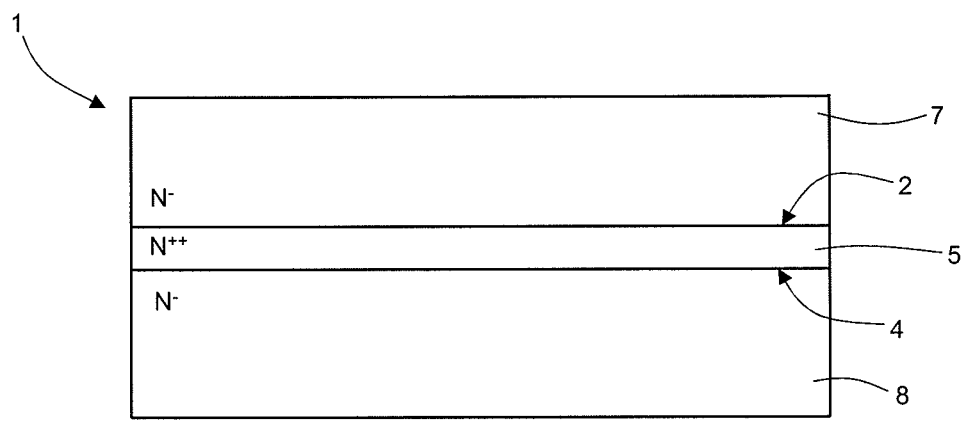
FIGS. 5-16 show, in cross-sectional view, steps of a method for manufacturing the semiconductor structure of FIG. 1.
Figure 6:
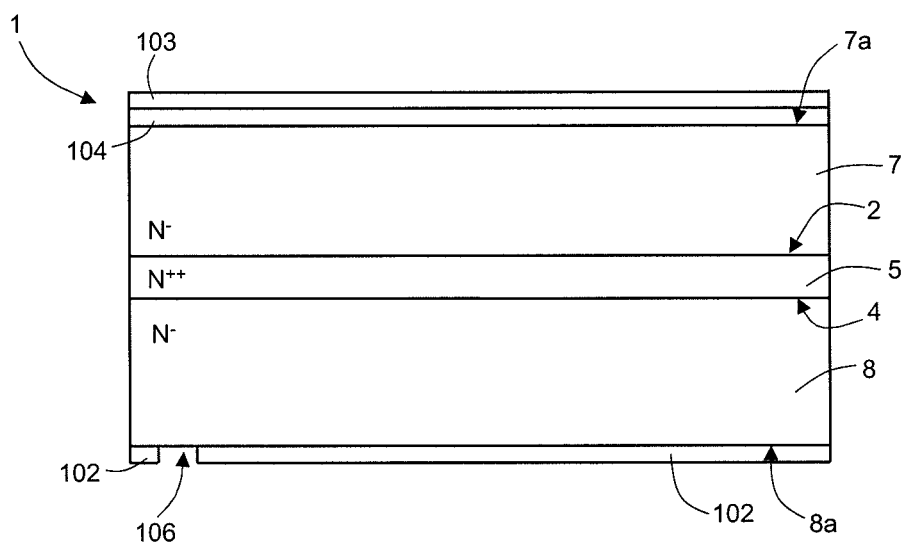
Figure 7:
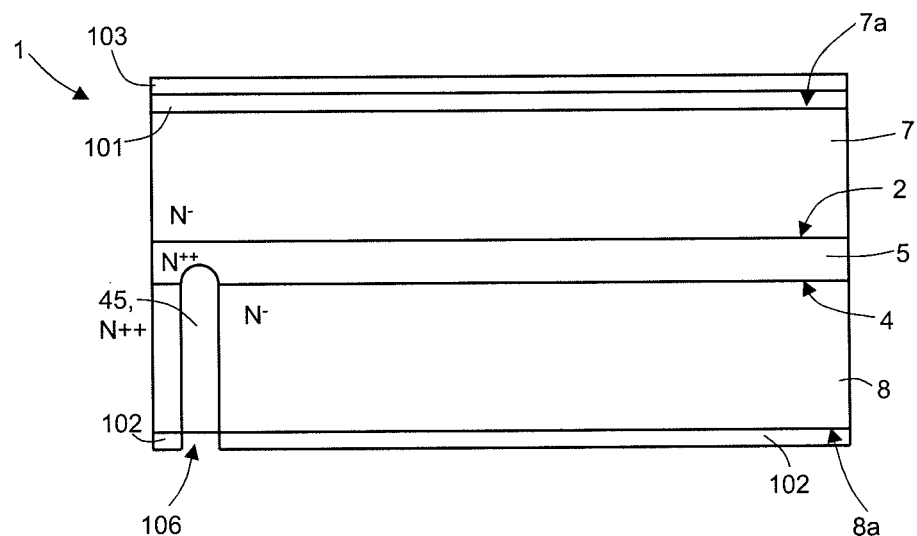

The process steps described with reference to FIGS. 5-7 regarding the electronic device 100 are common to the production of the electronic device 200 and consequently are not described any further herein.

Figure 8:
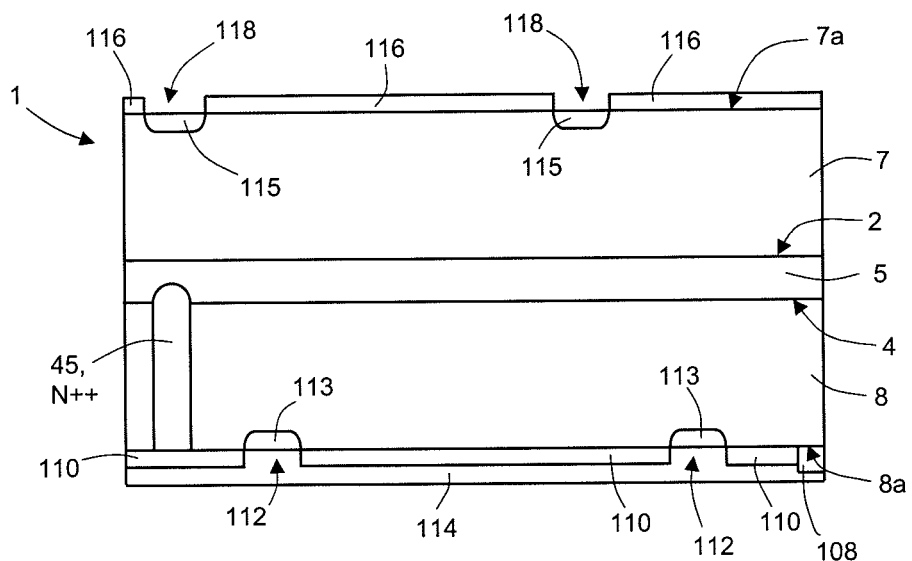
Figure 9:
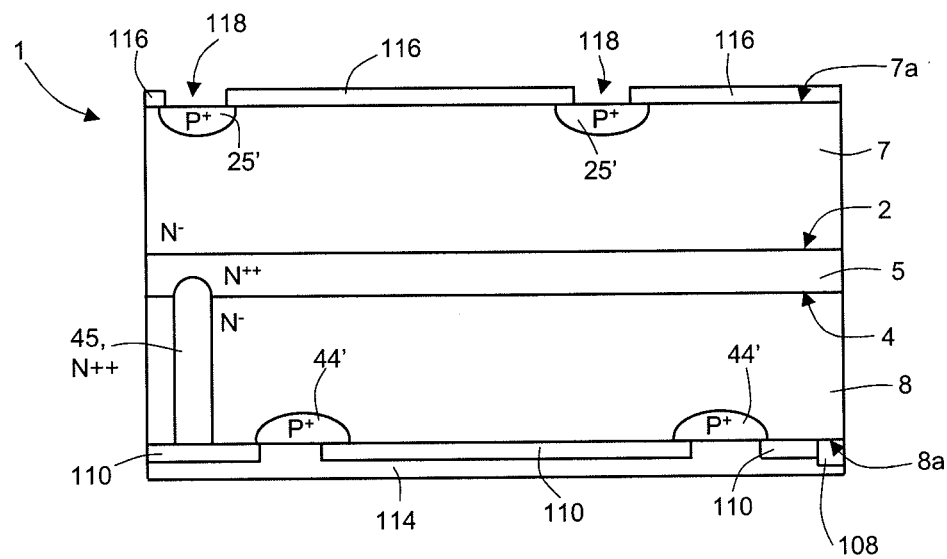
Figure 10:
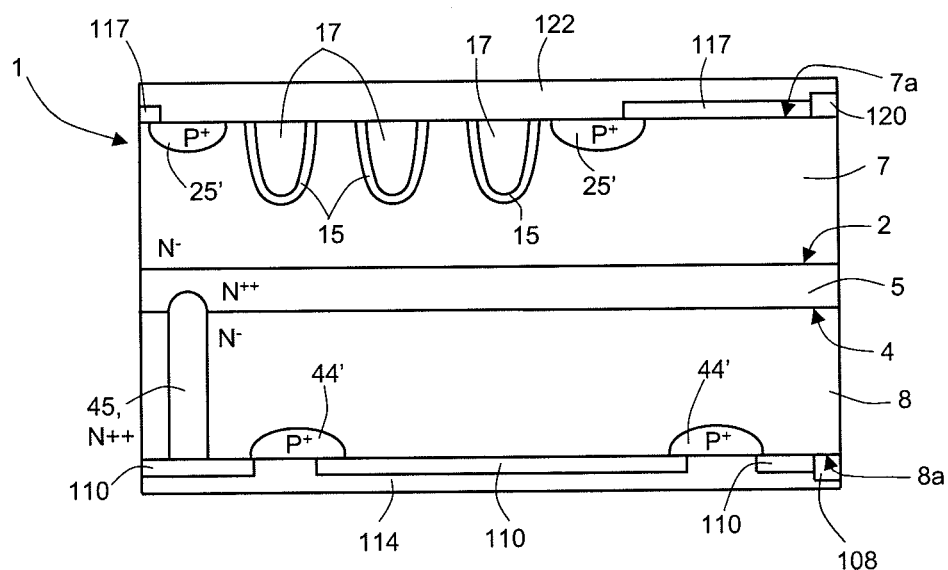
Figure 11:
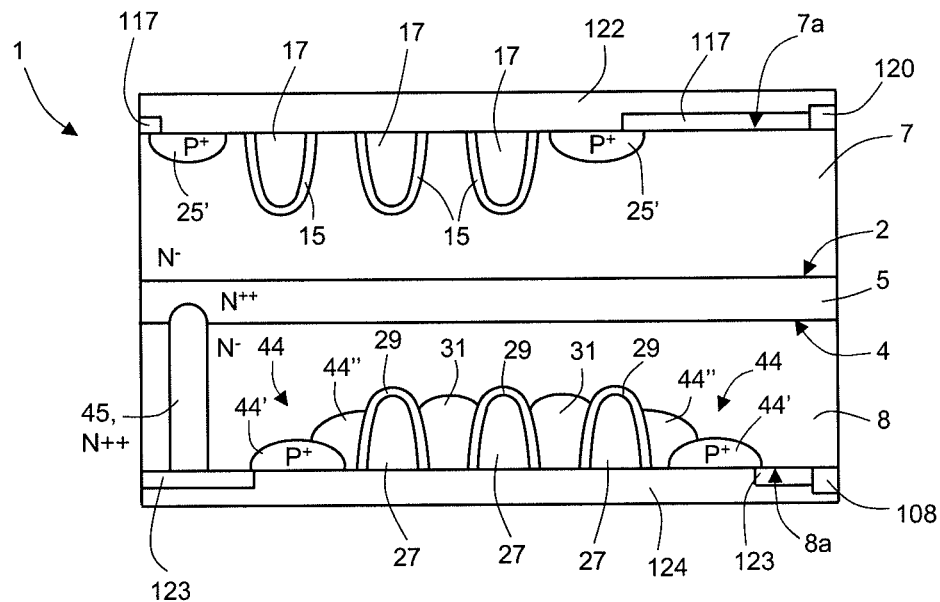
Figure 12:
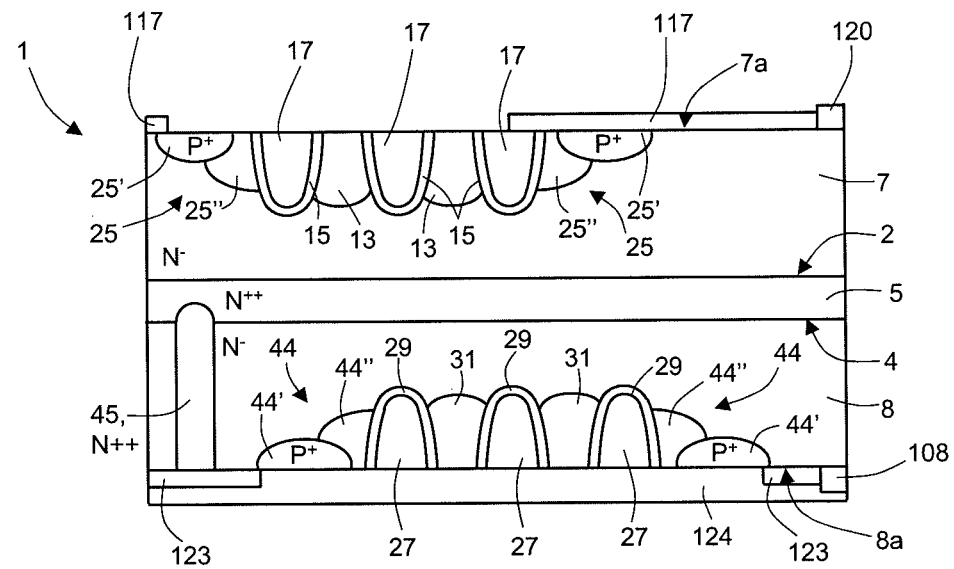
Figure 17:
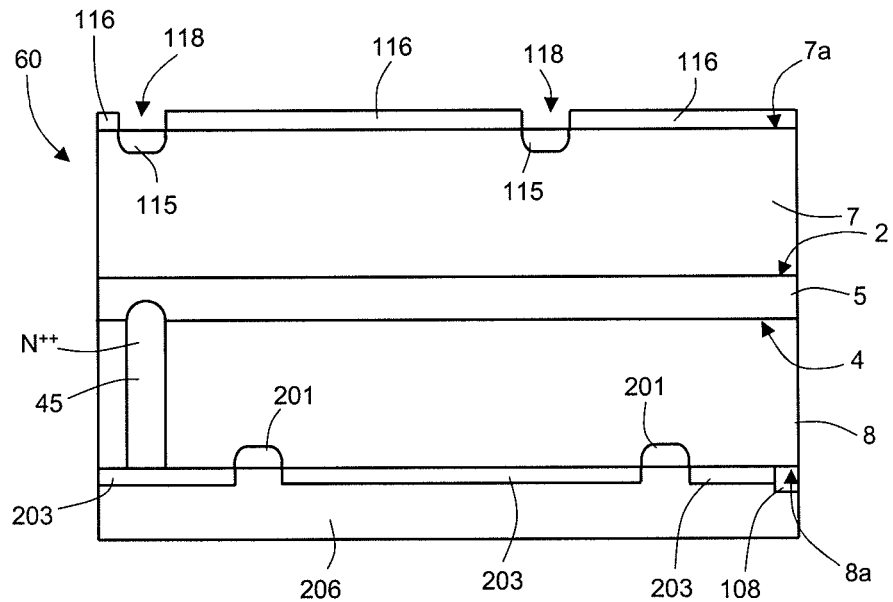
FIGS. 17-21 show, in cross-sectional view, steps of a method for manufacturing the semiconductor structure of FIG. 3.

As illustrated in FIG. 17, following upon the steps described with reference to FIGS. 5-7, a third implanted region 201, obtained by means of ion implantation of dopant species of a P type, in the second epitaxial layer 8, and the second implanted region 115 are formed (in a way similar to what has been described as regards FIG. 8). The third implanted region 201 can differ in shape and dimensions from the first implanted region 113 of FIG. 8; for example, it could have different (larger or smaller) dimensions and/or a different dose of dopant.

The dimensions of the third implanted region 201 are defined by a fifth mask layer 203, for example, of silicon oxide, formed on the surface 8a of the second epitaxial layer 8. There is then formed a fifth protective layer 206, for example of polysilicon, on the fifth mask layer 203 and the ring structure 66, to protect them during subsequent steps of the method.

Figure 18:
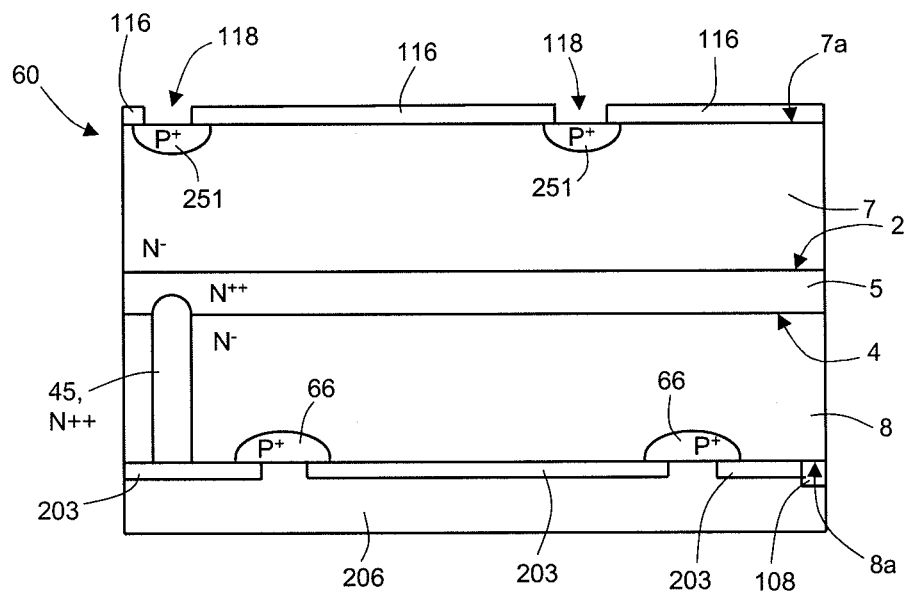

Next (FIG. 18), through a thermal annealing, for example at a temperature of 1100° C., the implanted dopant species are activated and their diffusion is favored, to form the first portion 25' of the first guard ring 25 and the ring structure 66. The ring structure 66 has, in top plan view, for example, a circular or quadrangular shape, a width of between 5 μm and 400 μm, preferably 5 μm, and an extension in depth in the second epitaxial layer 8 of between 1 μm and 5 μm, preferably 1 μm.

Figure 19:
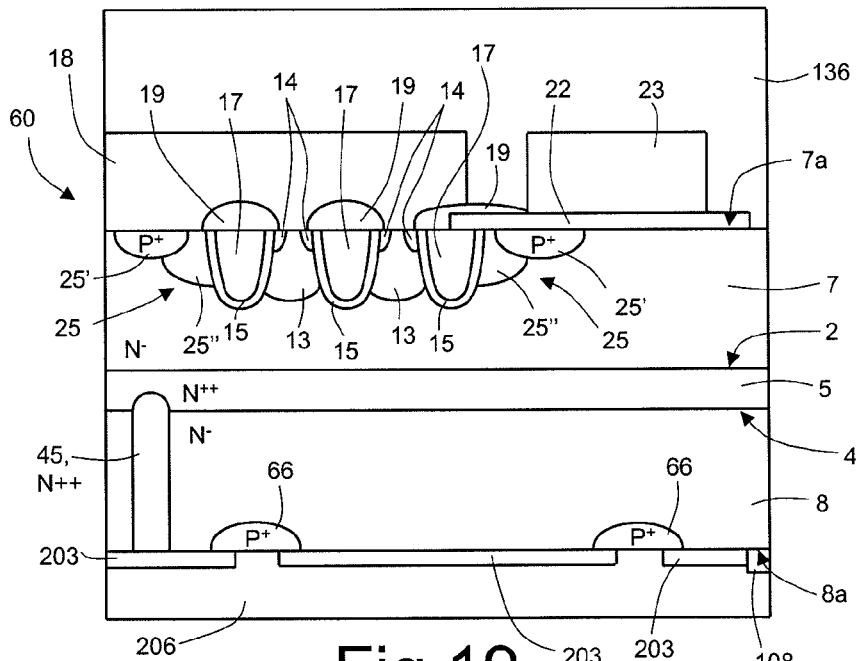

Then (FIG. 19), on the opposite side of the wafer 60, the first transistor element 10 is formed, according to the process steps already described with reference to FIGS. 10-16. In this case, however, only process steps are performed to form the first transistor element 10 in the first epitaxial layer 7 and not also the steps to obtain the second transistor element 12 in the second epitaxial layer, as is instead further described with reference to FIGS. 10-16.

Figure 20:
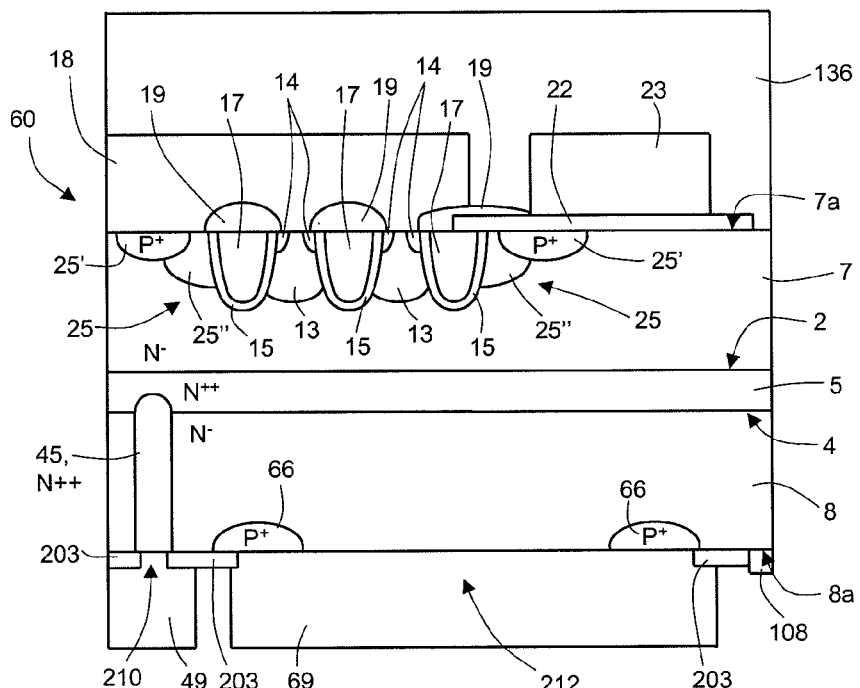

Next (FIG. 20), formation of the Schottky diode 62 is completed in the second epitaxial layer 8. In particular, the fifth protective layer 206 is removed completely, and respective windows 210, 212 are opened on the drain region 45, the ring structure 66, and the portion of the second epitaxial layer 8 delimited internally by the ring structure 66. There is then formed, on the second epitaxial layer 8 and in electrical contact with the latter through the windows 210, 212, a layer of conductive material, preferably metal, for example a barrier of a TiTiN and AlSi type, and it is defined by lithography and etching steps to form the drain metallization 49 in electrical contact with the drain region 45, and the anode metallization 69, in electrical contact with the ring structure 66 and the portion of second epitaxial layer 8 delimited by the ring structure 66. In this step, if necessary, the first alignment marks 108 are renewed.

Figure 21:
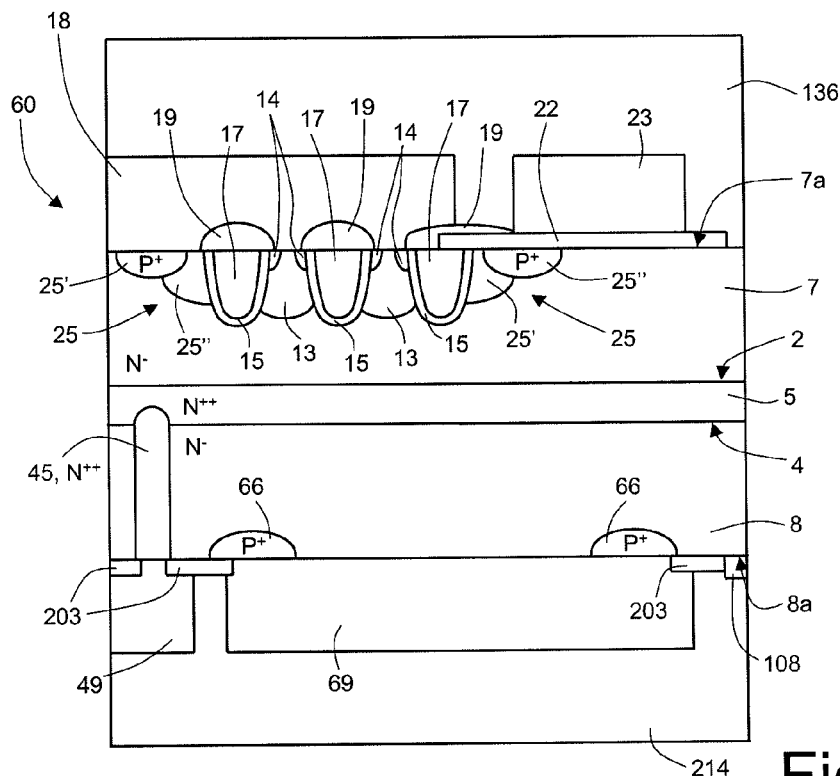

Then (FIG. 21), a third passivating layer 214, for example of deposited PSG (PhosphoSilicate Glass) is formed on the wafer 1, on the second epitaxial layer 8. The first and third passivating layers 136, 214 are selectively removed, forming the first and third protective layers 46, 72. In particular, the first and third protective layers 46, 72 have the function of guaranteeing the electrical insulation of the first source-contact metallization 18 from the first gate-contact metallization 23 and of guaranteeing electrical insulation of the drain metallization 49 from the anode metallization 69. There can then be formed the first source terminal 20, the first gate terminal 24, the drain terminal 47, and the anode terminal 6, 8 to obtain the electronic device 200 illustrated in FIG. 3.

Figure 22:
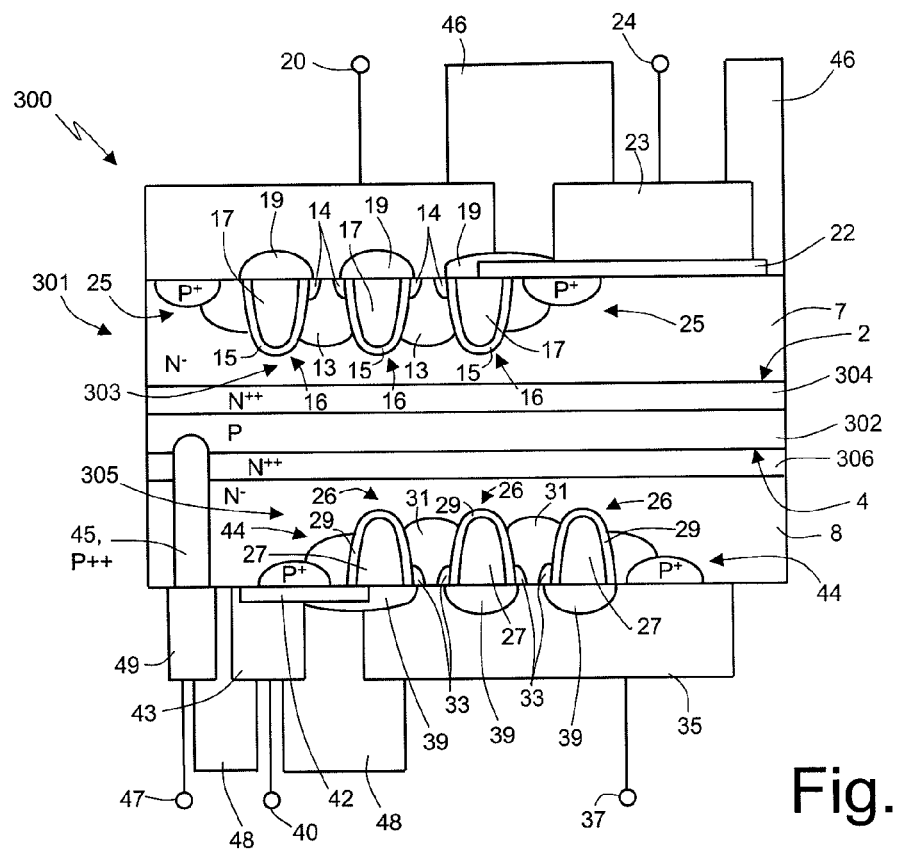
FIG. 22 shows a cross-sectional view of a semiconductor structure comprising active electronic devices, in particular IGBTs, provided on both sides of the structure according to a further embodiment of the present invention.

FIG. 22 shows, in cross-sectional view, an electronic device 300 according to a further embodiment of the present invention. In particular, the electronic device 300 comprises a first IGBT (Insulated Gate Bipolar Transistor) 303 and a second IGBT 305, provided on opposite sides of a wafer 301.

According to this embodiment of the present invention, the wafer 301 comprises a substrate 302 of a P type. Furthermore, the wafer 301 comprises, on opposite sides of the substrate 302 and in direct contact therewith, a first buffer layer 304 and a second buffer layer 306, of an N++ type, formed for example by epitaxial growth. The first and second buffer layers 304, 306 have a respective thickness of between 1 μm and 20 μm, preferably 10 μm. Then, on the first and second buffer layers 304, 306, the first and second epitaxial layers 7, 8 are respectively formed, according to the technique described previously. Subsequent process steps for the production of the IGBTs 303, 305 are similar to the steps described previously with reference to FIGS. 6-16. However, in this case, the drain region 45 is of a P++ type.

Alternatively, the first and second buffer layers 304, 306 can be formed by means of a step of deep implantation of dopant species of an N type. In this case, grown on opposite sides of the substrate 302 are the first and second epitaxial layers 7, 8 and there a step of deep ion implantation of dopant species of an N type is then performed at an energy such as to form the first and second buffer layers 304, 306 in a region of interface between the first and second epitaxial layers 7, 8 and the substrate 302.

From an examination of the characteristics described and illustrated herein, the advantages that the invention affords emerge clearly.

In particular, the occupation of area for a single wafer is substantially halved. Furthermore, both the static and dynamic performance of the electronic devices obtained according to the present invention are considerably improved.

For instance, it is possible to use a multiple packaging and obtain a monolithic half-bridge configuration.

Finally, since according to the present invention active elements of types different from one another (for example, MOSFETs and Schottky diodes) can work together without any need for external electrical connections, the parasitic inductances are reduced considerably.

Finally, it is clear that modifications and variations may be made to what is described and illustrated herein, without thereby departing from the sphere of protection of the present invention, as defined in the annexed claims.

For example, it is possible to provide electronic devices including Schottky diodes, or diodes of some other type, on both sides of the wafer, or further combinations of diodes and transistors.

Furthermore, the drain region 45 can be formed in ways alternative to what has been described previously. For example, an etch of the second epitaxial layer 8 (and, if present, of the second buffer layer 306) is performed, thus forming a deep trench which extends from the surface 8*a* of the second epitaxial layer as far as the substrate 5 (or substrate 306). Said deep trench can be filled with conductive material, for example polysilicon with a doping of an N or P type, or metal, such as for example aluminium, according to the embodiment of FIGS. 1 and 3 or of FIG. 22, to form the drain region 45. It is evident that, irrespective of the process of formation of the drain region 45, this can extend indifferently within the second epitaxial layer 8 (and, if present, the second buffer layer 306) or within the first epitaxial layer 7 (and, if present, the first buffer layer 304) until it contacts the substrate 5 (or substrate 302).

Furthermore, the gate region of the transistor elements illustrated in FIGS. 1, 3 and 22 can be obtained with a shape different from the one illustrated, and in particular can be provided on the surface 7*a* (and/or the surface 8*a*) of the first epitaxial layer 7 (and/or the second epitaxial layer 8).

In addition, to improve the electrical contact between the source-contact metallizations 18 and 35 and the respective source regions 14, 33 and body regions 13, 31, there can be formed respective conductive interface layers, for example of titanium or tungsten or their compounds, on top of, and in direct electrical contact with, the surfaces 7*a* and 8*a* of the epitaxial layers 7 and 8.

Furthermore, it is evident that, even though each electronic device 100, 200, 300 comprises a plurality of respective source regions 14, 33 and gate regions 16, 26 of the transistor devices 10, 12, 303, 305 formed therein, it is possible to obtain electronic devices 100, 200, 300 including transistor devices 10, 12, 303, 305, each having a single gate region 16, 26 and a single source region 14, 33.

Finally, the method described can be used, with obvious modifications to the process, to obtain P-channel transistor elements 10, 12.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor structure comprising:
   a substrate of semiconductor material of a first type of conductivity;
   a first semiconductor layer of the first type of conductivity arranged in electrical contact with the substrate on a first side of the substrate;
   a second semiconductor layer of the first type of conductivity arranged in electrical contact with the substrate on a second side of the substrate;
   a first active electronic device comprising a first conduction terminal formed in the first semiconductor layer;
   a second active electronic device comprising a second conduction terminal formed in the second semiconductor layer; and
   a third conduction terminal common to the first active electronic device and to the second active electronic device, wherein the third conduction terminal comprises a via region extending from a surface of the second semiconductor layer at least partially into the substrate and filled with conductive material of the first type of conductivity.

2. The structure according to claim 1, wherein the first semiconductor layer and the second semiconductor layer are a same thickness that is between 2 microns and 500 microns.

3. The structure according to claim 2, wherein the third conduction terminal and the substrate are highly doped.

4. The structure according to claim 2 wherein at least one of the first and second active electronic devices further comprises a first control terminal.

5. The structure according to claim 4, further comprising at least a second control terminal, wherein the first conduction terminal and the first control terminal are, respectively, a source terminal and a gate terminal of a first vertical-channel transistor device, and the second conduction terminal and the second control terminal are, respectively, a source terminal and a gate terminal of a second vertical-channel transistor device, and the third conduction terminal is a drain terminal common to the first and the second vertical-channel transistor devices.

6. The structure according to claim 5, wherein the first and the second active electronic devices comprise a respective plurality of source terminals and gate terminals of respective vertical-channel transistor devices.

7. The structure according to claim 4, wherein the first conduction terminal and the first control terminal are, respectively, a source terminal and a gate terminal of a first vertical-channel transistor device, the second conduction terminal is an anode terminal of a diode device, and the third conduction terminal forms both a drain terminal of the first vertical-channel transistor device and a cathode terminal of the diode device.

8. The structure according to claim 1, further comprising a first annular guard region, of a second type of conductivity, extending within the first semiconductor layer and facing a surface of the first semiconductor layer, and a second annular guard region, of the second type of conductivity, extending within the second semiconductor layer and facing a surface of the second semiconductor layer, said first annular guard region delimiting externally the first active electronic device, and said second annular guard region delimiting externally the second active electronic device.

9. The structure according to claim 8, further comprising a conductive anode biasing region in electrical contact with the second annular guard region and with a portion of the second semiconductor layer delimited by the second annular guard region.

10. The structure according to claim 1, further comprising a third semiconductor layer, of a second type of conductivity, sandwiched between the substrate and the first semiconductor layer, and a fourth semiconductor layer, of the second type of conductivity, sandwiched between the substrate and the second semiconductor layer.

11. The structure according to claim 10, wherein the third conduction terminal extends through the second semiconductor layer and the fourth semiconductor layer as far as the substrate.

12. A method for manufacturing a semiconductor structure comprising the steps of:
providing a substrate of semiconductor material of a first type of conductivity and having a first side and a second side, opposite to one another;
forming, on the first side of the substrate, a first semiconductor layer;
forming, on the second side of the substrate, a second semiconductor layer;
forming, in the first semiconductor layer, a first active electronic device; and
forming, in the second semiconductor layer, a second active electronic device,
wherein the step of forming the first active electronic device comprises the steps of farming at least a first conduction terminal, and the step of forming the second active electronic device comprises forming at least a second conduction terminal, the method moreover comprising the step of forming, in the second semiconductor layer and, at least partially, in the substrate a third conduction terminal, and wherein the step of forming the third conduction terminal comprises etching the second semiconductor layer and, at least partially, the substrate to form a trench and filling said trench with conductive material of the first type of conductivity.

13. The method according to claim 12, wherein the step of forming the first semiconductor layer comprises epitaxially growing a semiconductor layer on the first side of the substrate, and the step of forming the second semiconductor layer comprises epitaxially growing a semiconductor layer on the second side of the substrate.

14. The method according to claim 12, further comprising the steps of forming, in the first semiconductor layer externally to the first active electronic device, a first annular guard region; and forming, in the second semiconductor layer externally to the second active electronic device, a second annular guard region.

15. The method according to claim 14, further comprising the step of forming a conductive anode biasing region, on top of, and in direct electrical contact with, the second annular guard region and an anode region of the second semiconductor layer, said anode region being delimited by the second annular guard region.

16. The method according to claim 12 wherein the substrate and the third conduction terminal are highly doped.

17. The method according to claim 16, wherein the second semiconductor layer is of the first type of conductivity.

18. The method according to claim 12, wherein the step of forming the first active electronic device further comprises forming at least a first control terminal and/or the step of forming the second active electronic device moreover comprises forming at least a second control terminal.

19. The method according to claim 12, wherein the thickness of the second semiconductor layer is between 2 microns and 500 microns and is of the same thickness as the first semiconductor layer.

20. The method according to claim 12, further comprising the steps of forming a third semiconductor layer, of a second type of conductivity, between the substrate and the first semiconductor layer, and forming a fourth semiconductor layer, of the second type of conductivity, between the substrate and the second semiconductor layer.

21. The method according to claim 20, wherein the steps of forming the third semiconductor layer and the fourth semiconductor layer comprise carrying out an epitaxial growth on the first and second sides of the substrate prior to formation of the first semiconductor layer and, respectively, the second semiconductor layer.

22. The method according to claim 20, wherein the steps of forming the third semiconductor layer and the fourth semiconductor layer comprise the steps of forming the first and second semiconductor layers and the steps of introducing dopant species of a second type of conductivity in a first region of interface between the first semiconductor layer and the substrate and in a second region of interface between the second semiconductor layer and the substrate.

* * * * *

UNITED STATES PATENT AND TRADEMARK OFFICE
CERTIFICATE OF CORRECTION

| | | |
|---|---|---|
| PATENT NO. | : 8,525,253 B2 | Page 1 of 1 |
| APPLICATION NO. | : 12/913316 | |
| DATED | : September 3, 2013 | |
| INVENTOR(S) | : Monica Micciche' et al. | |

It is certified that error appears in the above-identified patent and that said Letters Patent is hereby corrected as shown below:

In the Claims:

Claim 12, column 13, line 19 should read:
comprises the steps of forming at least a first conduction Signed and Sealed this
Eighth Day of October, 2013

Teresa Stanek Rea
*Deputy Director of the United States Patent and Trademark Office*